United States Patent
Lee et al.

(10) Patent No.: US 8,093,124 B2
(45) Date of Patent: Jan. 10, 2012

(54) METHOD OF MANUFACTURING NONVOLATILE MEMORY DEVICE

(75) Inventors: Myung Shik Lee, Seoul (KR); Jin Gu Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/954,321

(22) Filed: Nov. 24, 2010

(65) Prior Publication Data

US 2011/0207287 A1    Aug. 25, 2011

(30) Foreign Application Priority Data

Feb. 25, 2010   (KR) .................... 10-2010-0017052

(51) Int. Cl.
*H01L 21/225* (2006.01)
(52) U.S. Cl. ................. 438/257; 257/E21.149
(58) Field of Classification Search ........... 257/E21.148, 257/E21.149, E21.15, E21.151, E21.546; 438/257, 261, 264, 265, 424, 433
See application file for complete search history.

(56) References Cited

U.S. PATENT DOCUMENTS

2009/0294828 A1 * 12/2009 Ozawa et al. ............... 257/319

FOREIGN PATENT DOCUMENTS

| KR | 1020080001272 | 1/2008 |
| KR | 1020080001337 | 1/2008 |
| KR | 1020080099992 | 11/2008 |

OTHER PUBLICATIONS

Notice of Allowance issued from Korean Intellectual Property Office on Apr. 29, 2011.

* cited by examiner

*Primary Examiner* — William D Coleman
*Assistant Examiner* — Daniel Shook
(74) *Attorney, Agent, or Firm* — IP & T Group LLP

(57) ABSTRACT

A method of manufacturing a nonvolatile memory device includes forming a tunnel insulating layer over a semiconductor substrate, forming a charge trap layer, including first impurity ions of a first concentration, over the tunnel insulating layer, forming a compensation layer, including second impurity ions of a second concentration, over the charge trap layer, diffusing the second impurity ions within the compensation layer toward the charge trap layer, removing the compensation layer, forming a dielectric layer on surfaces of the charge trap layer, and forming a conductive layer for a control gate on the dielectric layer.

20 Claims, 7 Drawing Sheets

METHOD OF MANUFACTURING NONVOLATILE MEMORY DEVICE

CROSS-REFERENCE TO RELATED APPLICATION

Priority to Korean patent application number 10-2010-0017052 filed on Feb. 25, 2010, the entire disclosure of which is incorporated by reference herein, is claimed.

BACKGROUND

Exemplary embodiments relate to a method of manufacturing a nonvolatile memory device and, more particularly, to a method of manufacturing a nonvolatile memory device, which is capable of compensating for the concentration of impurity ions in a charge trap layer.

Among nonvolatile memory devices, a NAND flash memory device having a structure advantageous for a high degree of integration is being actively developed. In the NAND flash memory device, a memory cell can be programmed with a desired threshold voltage by controlling electrons trapped/stored in the charge trap layer of the memory cell. The amount of charges trapped into the charge trap layer when the program is performed can be controlled by supplying a specific voltage to a control gate formed over the charge trap layer with a dielectric layer formed therebetween. Accordingly, a coupling ratio, which is a ratio of a voltage supplied to the control gate to a voltage induced to the charge trap layer, becomes an important factor to determine the operating characteristics of the NAND flash memory device. In particular, when the coupling ratio remains consistent, a distribution characteristic with respect to threshold voltages of the device can be prevented from being deteriorated without the occurrence of an Abnormal Program Cell (APC). Further, the failure of a read operation can be prevented as well.

However, the coupling ratio may vary due to a depletion phenomenon occurring in the charge trap layer. The charge trap layer is mainly made of polysilicon including impurity ions. The impurity ions included in the charge trap layer may continue to be discharged externally because of heat generated in subsequent processes. If the concentration of impurity ions included in the charge trap layer is excessively lowered, the depletion phenomenon occurs, which may deteriorate a distribution characteristic of threshold voltages of the device and cause a read operation to fail.

In order to address the above concerns, after forming the charge trap layer including the impurity ions, additional impurity ions may be implanted into the charge trap layer through an additional impurity ion implantation process. However, the additional impurity ions may also be implanted into a portion which is not intended to be implanted (e.g., the active region of a semiconductor substrate used as a channel), and thus the threshold voltage Vt of a memory cell can shift.

BRIEF SUMMARY

Exemplary embodiments relate to a method of manufacturing a nonvolatile memory device, which is capable of compensating for the concentration of impurity ions in a charge trap layer in such a way that impurity ions within a compensation layer are diffused into the charge trap layer.

A method of manufacturing a nonvolatile memory device according to an exemplary aspect of the present disclosure includes forming a tunnel insulating layer over a semiconductor substrate, forming a charge trap layer, including first impurity ions of a first concentration, over the tunnel insulating layer, forming a compensation layer, including second impurity ions of a second concentration, over the charge trap layer, diffusing the second impurity ions within the compensation layer toward the charge trap layer, removing the compensation layer, forming a dielectric layer on the surface of the charge trap layer, and forming a conductive layer for a control gate on the dielectric layer.

A method of manufacturing a nonvolatile memory device according to another exemplary aspect of the present disclosure includes forming tunnel insulating layer over a semiconductor substrate, forming charge trap layer, including first impurity ions of a first concentration, over the tunnel insulating layer, forming a first dielectric layer, including second impurity ions of a second concentration, along the surface of the charge trap layer, diffusing the second impurity ions within the first dielectric layer toward the charge trap layer, stacking second and third dielectric layers over the first dielectric layer, and forming a conductive layer for a control gate on the third dielectric layer.

Before the forming of the first dielectric layer, the method may further include patterning the tunnel insulating layer and the charge trap layer to expose the semiconductor substrate, etching the exposed semiconductor substrate to form trenches, and filling the trenches with isolation insulation layers.

A top surface of the isolation insulation layers may be lower than a top surface of the charge trap layer, and higher than a top surface of the tunnel insulating layer.

After forming the isolation layers, the surface of the patterned charge trap layer may be oxidized during the forming of the first dielectric layer.

After forming the isolation layers, the method may further include forming an oxide layer by oxidizing the surface of the patterned charge trap layer, and removing the oxide layer to reduce the width of an upper side of the charge trap layer.

The first dielectric layer may be made of Phospho Silicate Glass (PSG) or Boron Silicate Glass (BSG) of a solid solution state.

The second dielectric layer may be formed of a nitride layer, and the third dielectric layer is formed of an oxide layer.

The charge trap layer may include a doped polysilicon layer formed using gas, including the first impurity ions, and a silicon (Si) source gas.

The charge trap layer may include a doped polysilicon layer formed by implanting the first impurity ions into an undoped polysilicon layer formed using a silicon (Si) source gas.

The first impurity ions may include 3-valence or 5-valence ions, and the second concentration may be higher than the first concentration. Further, the second impurity ions may have identical 3-valence or 5-valence ions as the first impurity ions.

A method of manufacturing a nonvolatile memory device according to another exemplary aspect of the present disclosure includes forming a charge trap layer doped with first impurity ions, having a first concentration, over a semiconductor substrate, patterning the charge trap layer to form trenches in the substrate between the patterned charge trap layer, filling the trenches with isolation layers to expose the upper side of the patterned charge trap layer, forming a compensation layer doped with second impurity ions, having a higher concentration than the first concentration, over the charge trap layer, and diffusing the second impurity ions within the compensation layer toward the charge trap layer.

DESCRIPTION OF EMBODIMENTS

Hereinafter, exemplary embodiments of the present disclosure will be described in detail with reference to the accompanying drawings. The figures are provided to enable those of ordinary skill in the art to make and use the exemplary embodiments of the disclosure.

FIGS. 1A to 1H are cross-sectional views illustrating a method of forming the patterns of a nonvolatile memory device according to a first exemplary embodiment of this disclosure. In particular, a method of manufacturing a NAND flash memory device is described below as an example with reference to FIGS. 1A to 1H.

Figure 1A:
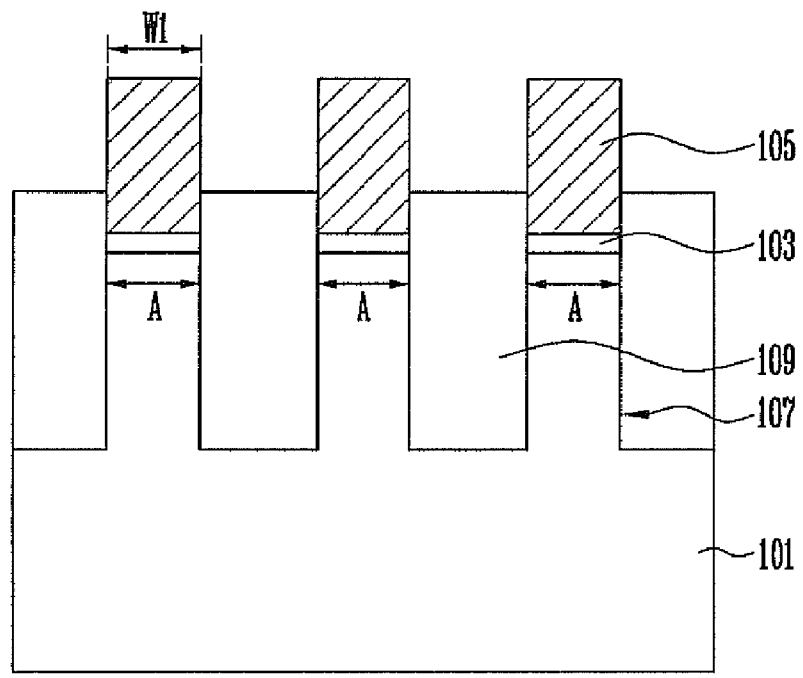
FIGS. 1A to 1H are cross-sectional views illustrating a method of forming the patterns of a nonvolatile memory device according to a first exemplary embodiment of this disclosure.

Referring to FIG. 1A, a semiconductor substrate 101 in accordance with the exemplary embodiment includes active regions A and isolation regions. Isolation structures, including trenches 107 and isolation layers 109, are formed in the respective isolation regions of the semiconductor substrate 101. Furthermore, patterned tunnel insulating layers 103 and charge trap layers 105 are formed over the active regions A of the semiconductor substrate 101. The active regions A are defined as portions of the substrate between the plurality of isolation structures which are spaced from each other.

Examples of a method of forming the isolation structures and a method of patterning the tunnel insulating layers 103 and the charge trap layers 105 are described in detail below.

First, a well (not shown) is formed in the semiconductor substrate 101. Next, the tunnel insulating layer 103, the charge trap layer 105, and an isolation hard mask pattern (not shown) are stacked over the semiconductor substrate 101 on which an ion implantation process for controlling the threshold voltage of memory cells has been performed.

The tunnel insulating layer 103 may include an oxide layer and can be formed by using an oxidization process or a deposition process.

The charge trap layer 105 may be formed of a polysilicon layer including first impurity ions (i.e., a doped polysilicon layer). The polysilicon layer including the first impurity ions can be formed by using silicon (Si) source gas and gas including the first impurity ions. Alternatively, the polysilicon layer including the first impurity ions can be formed by forming an undoped polysilicon layer by using silicon (Si) source gas and implanting the first impurity ions into the undoped polysilicon layer.

$SiH_4$ or $SiH_2Cl_2$ gas can be used as the silicon (Si) source gas. The gas including the first impurity ions can be gas including a 3-valence or 5-valence ion depending on the type of impurity ions to be doped into the polysilicon layer. For example, where a 3-valence ion, such as phosphorus (P), is sought to be doped into the polysilicon layer, $PH_3$ gas can be used as the gas including the impurity ions.

The isolation hard mask pattern is formed over the active regions A of the semiconductor substrate 101. Furthermore, the isolation hard mask pattern is formed to expose the charge trap layer 105 formed over the isolation regions. The exposed charge trap layer 105 is removed by using the isolation hard mask pattern as an etch mask. Thus, the tunnel insulating layer 103 formed over the isolation regions of the semiconductor substrate 101 is exposed. Next, the exposed tunnel insulating layer 103 is removed by using the isolation hard mask pattern as an etch mask, thereby exposing the isolation regions of the semiconductor substrate 101. Next, the exposed semiconductor substrate 101 is etched to a predetermined depth by using the isolation hard mask pattern as an etch mask, thereby forming the plurality of trenches 107. Next, the isolation hard mask pattern can be removed.

After forming the trenches 107, the isolation layer 109 having a thickness sufficient to fill the insides of the trenches 107 is formed over the semiconductor substrate 101. Next, a polishing process is performed to expose the charge trap layer 105. The polishing process can be performed by using a Chemical Mechanical Polishing (CMP) process. Thus, the isolation layers 109 having the same height as the charge trap layer 105 can be formed. Through the formation of the isolation layers 109, the plurality of active regions A spaced apart from one another by the isolation layers 109 and the trenches 107 is defined. Furthermore, the tunnel insulating layer 103 and the charge trap layer 105 remain over each of the active regions A of the semiconductor substrate 101. Thus, the active regions A are spaced apart from one another with the isolation layer 109 in between them, and the tunnel insulating layers 103 and the charge trap layers 105 are patterned as shown in FIG. 1A. Each of the patterned charge trap layers 105 has a first width W1.

Here, the isolation layers 109 can be made of oxide-series materials. For example, the isolation layer 109 can be formed of a High Temperature Oxide (HTO) layer, a High Density Plasma (HDP) oxide layer, a Tetra Ethyl Ortho Silicate (TEOS) layer, a Boron-Phosphorus Silicate Glass (BPSG) layer, or an Undoped Silicate Glass (USG) layer.

The isolation layers 109 have their height lowered by an etch process, such as etch-back, thereby forming the isolation structures having an Effective Field Height (EFH) controlled by the etch process. Here, a top surface of the isolation structures is preferably controlled to be lower than a top surface of the charge trap layers 105 such that the area where the charge trap layer 105 of a gate pattern comes into contact with a control gate layer can be increased and so the coupling ratio between them can be improved. Furthermore, the top surface of the isolation structures is preferably controlled to be higher than a top surface of the tunnel insulating layers 103 in order to prevent a leakage current from being generated because of the exposed active regions A.

As a result of the etch process for forming the isolation structures with the appropriate EFH, the charge trap layers 105 protrude from the isolation structures and thus sidewalls on the upper side of the charge trap layer 105 are exposed, while sidewalls on the lower side of the charge trap layer 105 are shielded by the isolation structures.

Figure 1B:
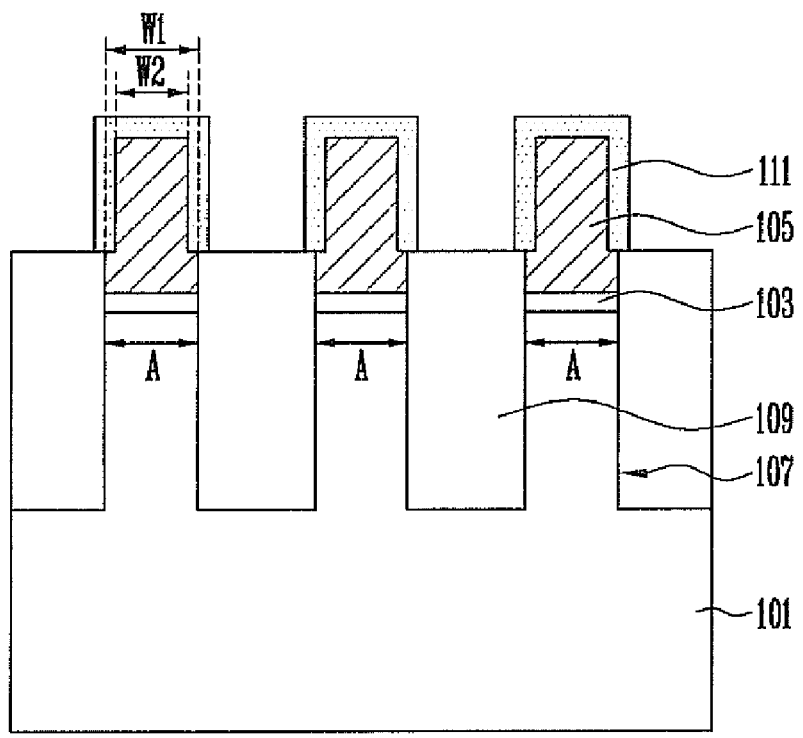

Referring to FIG. 1B, a process for reducing the width of the upper side of the charge trap layer 105, protruding from the isolation structure, (i.e., the first width W1, hereinafter referred to as a stop width'), to a second width W2 smaller than the first width W1 can be further performed. In this process, space between the patterned charge trap layers 105 is widened so that the space is not filled with a dielectric layer in a subsequent process and so a conductive layer for a control gate is formed therein.

In order to reduce the top width of the charge trap layer 105, the exposed surface of the top side of the charge trap layers 105 can be oxidized to a predetermined thickness. Accordingly, an oxide layer 111 is formed on the exposed surface of the charge trap layer 105, and the top width of the charge trap layer 105 becomes the second width W2, which is narrower than the first width W1.

Figure 1C:
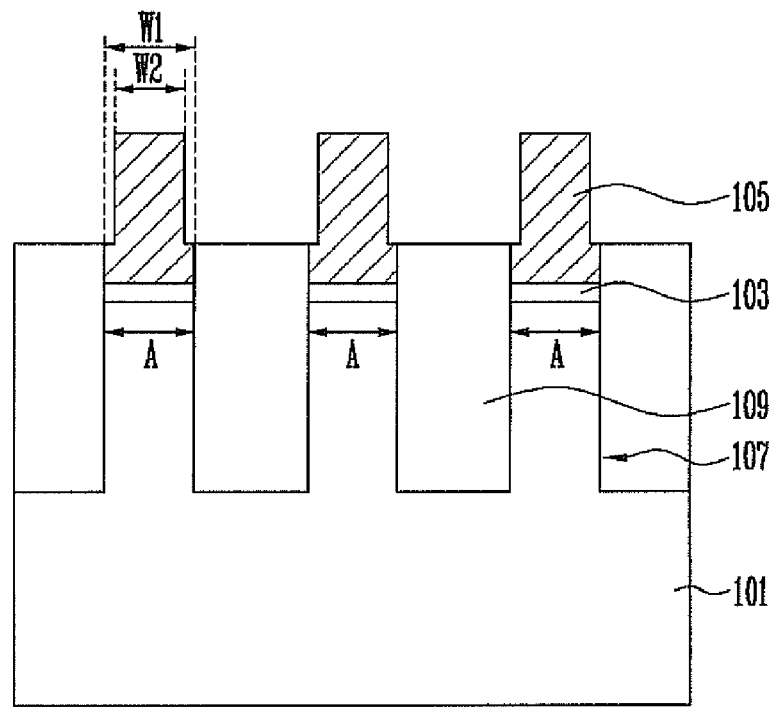

Referring to FIG. 1C, the oxide layers 111 are removed by using a wet cleaning process, thereby exposing the charge trap layers 105.

Figure 1D:
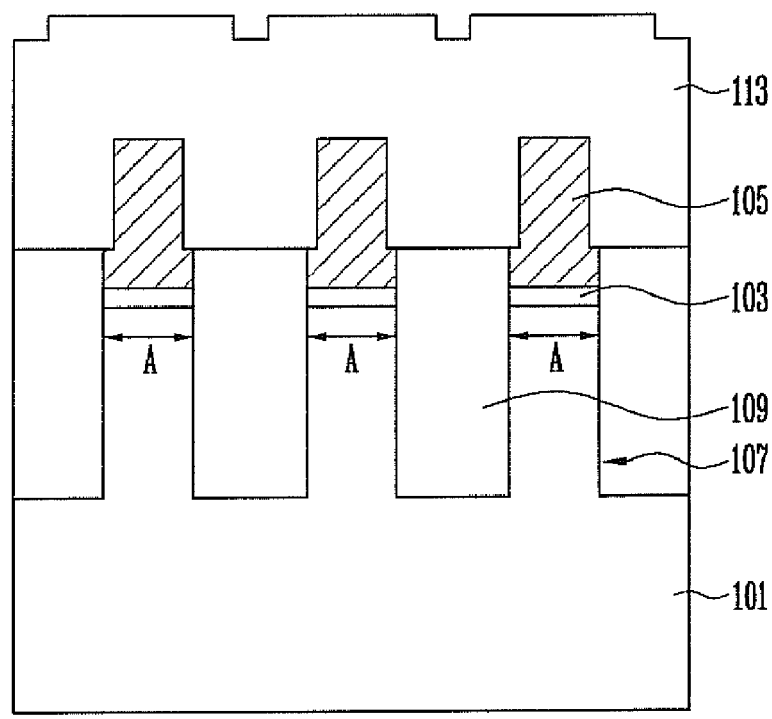

Referring to FIG. 1D, a compensation layer 113 is formed over the exposed charge trap layers 105 and the isolation layers 109. The compensation layer 113 preferably includes second impurity ions which are the same kind as the first impurity ions included in the charge trap layers 105. Furthermore, the compensation layer 113 preferably includes the second impurity ions having a concentration higher than that of the first impurity ions included in the charge trap layer 105.

That is, in case where n type (i.e., a 3-valence) impurity ions are included in the charge trap layer 105, the compensation layer 113 also includes the n type impurity ions, but the n type impurity ions in the compensation layer 113 preferably have a higher concentration than that in the charge trap layer 105. For example, in case where phosphorous (P) is included in the charge trap layer 105, the compensation layer 113 can be formed of a Phospho Silicate Glass (PSG) oxide layer of a solid solution state, having a higher concentration of phosphorous (P) than the charge trap layer 105.

The above PSG oxide layer can be formed through a deposition process using an Atmospheric Pressure Chemical Vapor Deposition (APCVD), Plasma Enhanced Chemical Vapor Deposition (PECVD), or Low Pressure Chemical Vapor Deposition (LPCVD) method. Furthermore, the PSG oxide layer can be formed using silicon (Si) source gas, source gas including impurity ions, and oxygen. For example, the PSG oxide layer ($SiO_2P_2O_5$) can be formed by using the silicon (Si) source gas of TEOS (Tetraethyl orthosilicate: $Si(OC_2H_5)_4$), the source gas including an n type impurity ion, such as $P(OCH_3)_3$ or TMOP (Trimethyl Phosphate: $PH_3$), and $O_3$. The PSG oxide layer preferably includes phosphorous (P) of 1 wt % or higher. The PSG oxide layer preferably has a thickness of 5 Å or more. The temperature for forming the PSG oxide layer is preferably 25° C. Also, the pressure for forming the PSG oxide layer is preferably 10 torr or higher. However, the concentration of impurity ions included in the PSG oxide layer and the temperature and pressure for forming the PSG layer can be set in various ways depending on the step coverage characteristic of the PSG oxide layer and the amount of impurity ions to be diffused into the charge trap layer 105 in a subsequent process.

Meanwhile, where p type (i.e., a 5-valence) impurity ions, such as boron (B), are included in the charge trap layer 105, the compensation layer 113 can be formed of a Boron Silicate Glass (BSG) oxide layer, including a higher concentration of boron (B) than the charge trap layer 105.

Figure 1E:
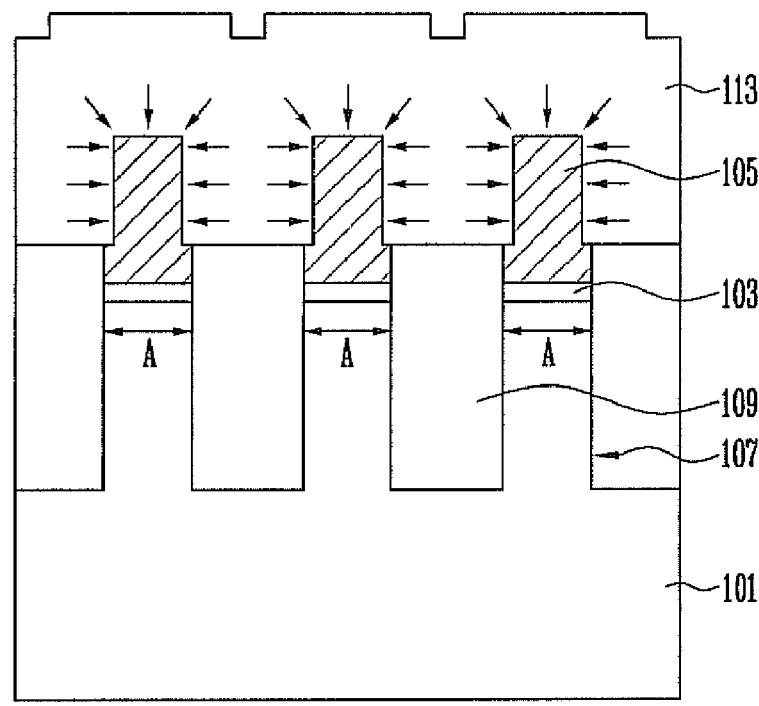

Referring to FIG. 1E, the second impurity ions within the compensation layer 113 are diffused toward the charge trap layers 105. The diffusion can be performed through an annealing process, such as a furnace process or a Rapid Thermal Process (RTP). During the diffusion process, temperature can be set in the range of 100° C. to 1000° C., preferably set to 780'C, so that the second impurity ions within the compensation layer 113 can be diffused toward the charge trap layers 105.

The second impurity ions within the compensation layer 113 are diffused and added to the charge trap layers 105. As the second impurity ions are added to the charge trap layer 105, they compensate for the lack of first impurity ions of the charge trap layer 105, which are lost after the charge trap layer 105 are formed.

As a result of the process of reducing the top width of the charge trap layer 105 as shown in FIGS. 1B and 1C, the concentration of the first impurity ions included in the charge trap layer 105 can be greatly lowered for reasons described below.

In general, the first impurity ions included in the charge trap layer 105 are gathered on a surface of the charge trap layer 105 because of heat generated during the process. Therefore, if the first impurity ions gathered on the surface of the charge trap layer 105 are removed by oxidizing the surface of the top side of the charge trap layer 105 as shown in FIGS. 1B and 1C, the concentration of the first impurity ions doped into the charge trap layer 105 becomes very low. In the first exemplary embodiment of this disclosure, as described above, the top width of the charge trap layer 105 is reduced, and the second impurity ions of the compensation layer 113 are then diffused into the charge trap layer 105. Accordingly, the concentration of the first impurity ions of the charge trap layer 105, lowered in the process of reducing the top width of the charge trap layer 105, can be compensated for.

As described above, in an exemplary embodiment of this disclosure, impurity ions are added to the charge trap layers 105 by using not an ion implantation process, but a diffusion process. Accordingly, a shift in the threshold voltage Vt of a channel can be prevented because the impurity ions are concentrated to the edges of the active regions A by the ion implantation process.

Figure 1F:
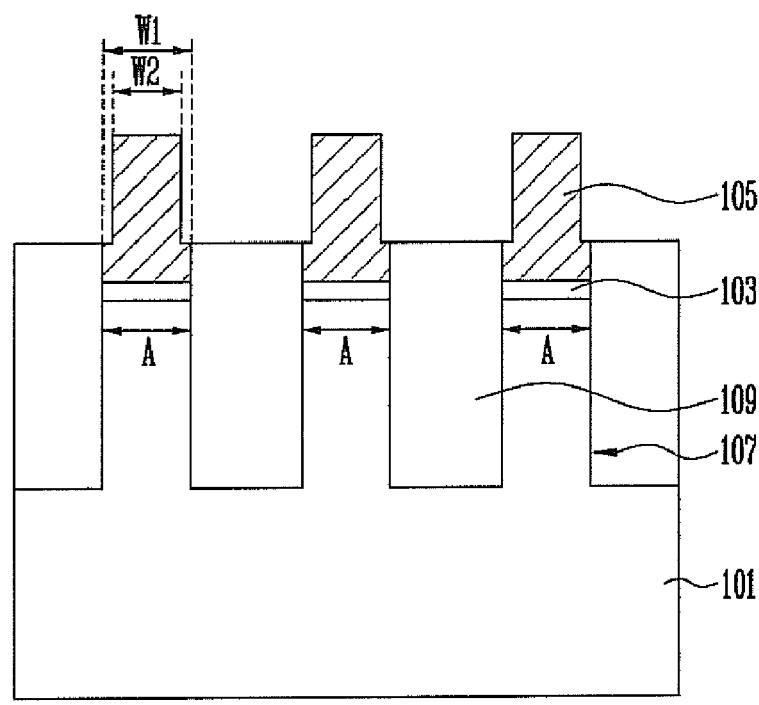

Referring to FIG. 1F, after performing the diffusion process, the compensation layer 113 is removed to expose the charge trap layers 105 and the isolation layers 109.

Figure 1G:
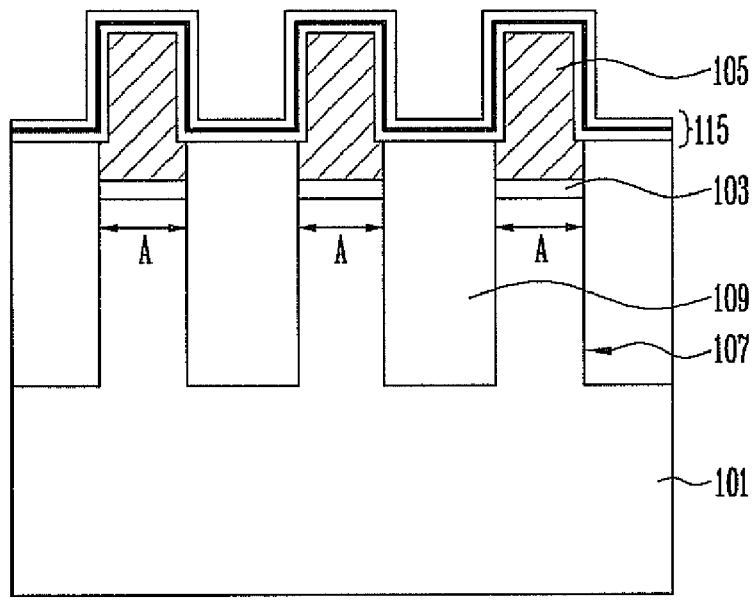

Referring to FIG. 1G, a dielectric layer 115 is formed on the exposed top surfaces and sidewalls of the charge trap layers 105 and the exposed top surfaces of the isolation layers 109. The dielectric layer 115 can be formed of a stack layer of an oxide layer, a nitride layer, and an oxide layer or can be formed of a high-k layer, such as an $Al_2O_3$ layer, a $ZrO_2$ layer, an $HfO_2$ layer, or a stack layer of them.

Meanwhile, the dielectric layer 115 is formed in the state in which the top width of the charge trap layer 105 is reduced though processes described in FIGS. 1B and 1C, and a gap between the charge trap layers 105 becomes wider than that at the previous process, i.e., in FIG. 1A. Accordingly, the dielectric layers 115 formed on the sidewalls of the charge trap layers 105 can be spaced apart from one another.

Figure 1H:
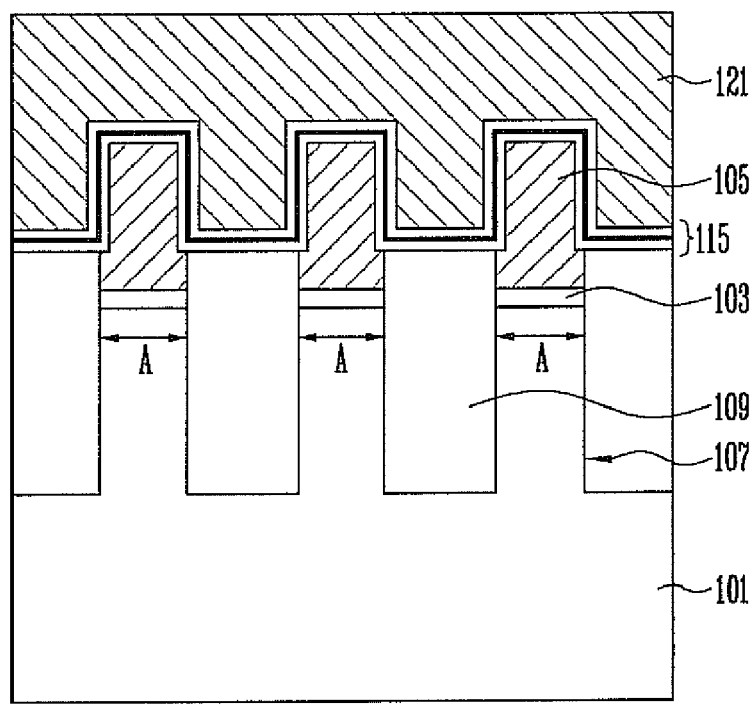

Referring to FIG. 1H, a conductive layer 121 for a control gate is formed over the dielectric layers 115. The conductive layer 121 can be formed of a polysilicon layer into which impurities are doped, a stack layer of a polysilicon layer and a metal silicide layer, or a stack layer of a polysilicon layer and a metal layer.

The conductive layer 121 is formed to fill the space between the sidewalk of the charge trap layers 105. The reason why the conductive layer 121 can be formed in the space between the sidewalls of the charge trap layers 105 is that the dielectric layers 115 formed on the sidewalls of the charge trap layers 105 are spaced apart from one another.

In the first exemplary embodiment of this disclosure, impurity ions within the compensation layer 113 are diffused into the charge trap layers 105 by means of the compensation layer 113, including the impurity ions having a higher concentration than impurity ions within the charge trap layers 105. Accordingly, a concentration of the impurity ions included in the charge trap layers 105 can be increased. Consequently, in an exemplary embodiment, the deterioration of a distribution characteristic with respect to threshold voltages of a NAND flash memory device and occurrence of a read operation failure because the concentration of the impurity ions within the charge trap layers 105 is lowered, can be prevented.

Meanwhile, in the first exemplary embodiment of this disclosure, impurity ions are added to the charge trap layers 105 by using a diffusion process, not an ion implantation process. Accordingly, the threshold voltage Vt of a channel can be prevented from shifting due to the impurity ions concentrated to the edges of the active regions A by the ion implantation process.

Figure 2A:
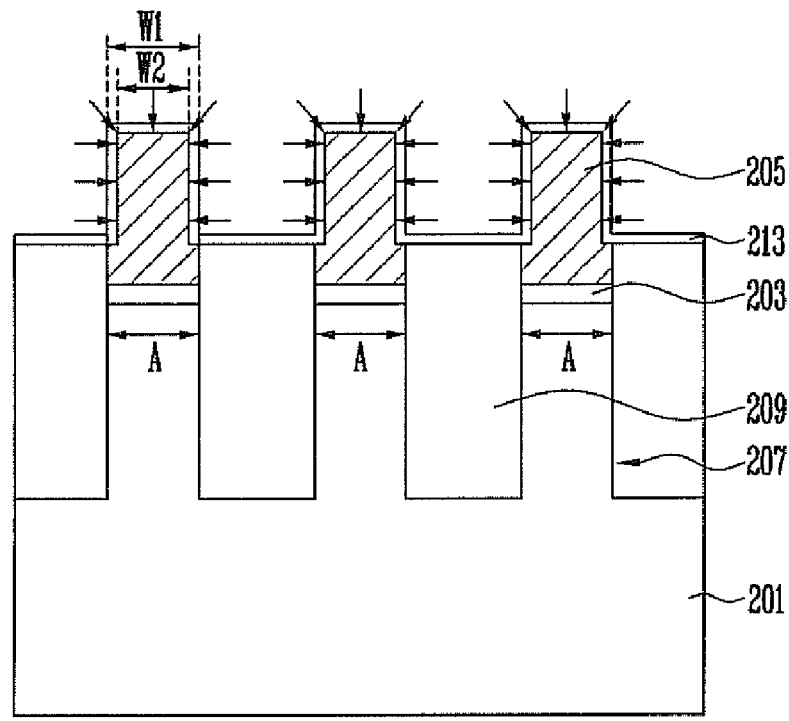
FIGS. 2A to 2C are cross-sectional views illustrating a method of forming the patterns of a nonvolatile memory device according to a second exemplary embodiment of this disclosure.
Figure 2B:
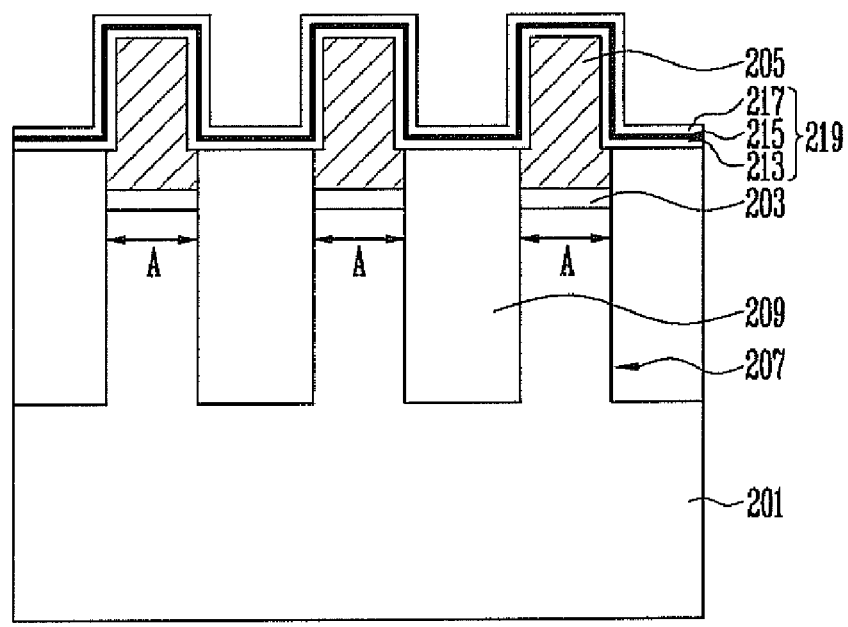
Figure 2C:
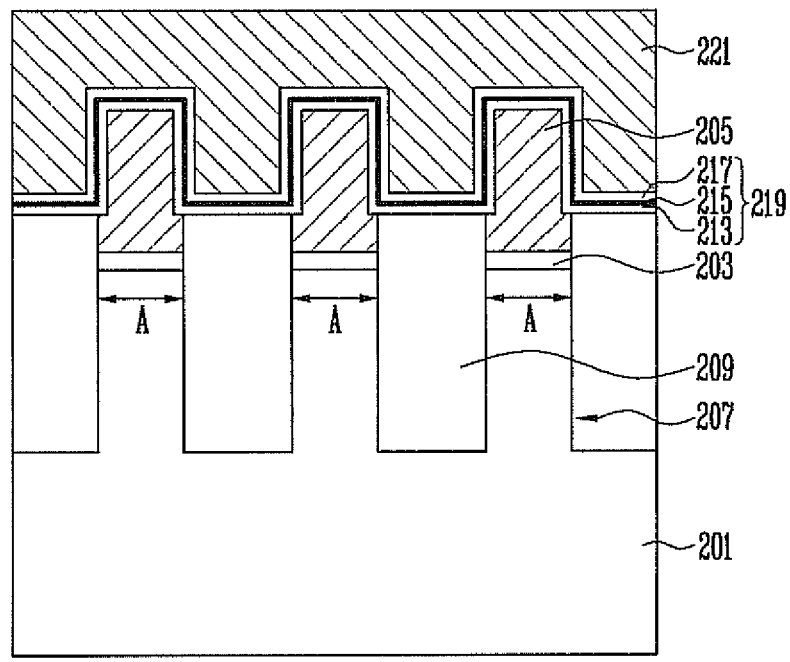

FIGS. 2A to 2C are cross-sectional views illustrating a method of forming the patterns of a nonvolatile memory device according to a second exemplary embodiment of this disclosure. In particular, a method of manufacturing a semiconductor memory device, for example, a NAND flash memory device, is described below with reference to FIGS. 2A to 2C.

Referring to FIG. 2A, there is provided a semiconductor substrate 201, including active regions A and isolation regions. Trenches 207 and isolation insulation layers 209 are formed in the respective isolation regions of the semiconductor substrate 201. Furthermore, a tunnel insulating layer 203 and a charge trap layer 205, including first impurity ions of a first concentration, are patterned to be formed with a first width W1 over the respective active regions A of the semiconductor substrate 201 which are spaced apart from one another by the trenches 207 and the isolation insulation layers 209.

A method of forming the trenches 207 and the isolation insulation layers 209 and a method of patterning the tunnel insulating layer 203 and the charge trap layer 205 are the same as those of FIG. 1A, and so descriptions thereof are omitted below.

Meanwhile, the isolation insulation layers 209 are etched by an etch process, such as etch-back, thereby forming isolation structures having a controlled Effective Field Height (EFH). Here, a top surface of the isolation structures is preferably controlled to be lower than a top surface of the charge trap layers 205 such that the area where the charge trap layer 205 of a gate pattern comes into contact with a control gate layer can be increased and so the coupling ratio between the charge trap layer 205 and the control gate layer can be improved. Furthermore, the top surface of the isolation structures is preferably controlled to be higher than a top surface of the tunnel insulating layers 203 in order to prevent a leakage current from being generated because of the exposed active regions A.

As a result of the etch process for forming the isolation structures with the appropriate EFH, sidewalls on the upper side of the charge trap layer 205, protruding from the isolation structure, are exposed, but sidewalls on the lower side of the charge trap layer 205 are shielded by the isolation structures.

Next, a process for reducing the width of the upper side (hereinafter referred to as a 'top width') of the charge trap layer 205, protruding from the isolation structure, to a second width W2 smaller than the first width W1 can be further performed. The above process can be performed by using the same method as described with reference to FIGS. 1B and 1C. Next, a first dielectric layer 213 is formed on the exposed top surfaces and sidewalls of the charge trap layers 205 and the top surfaces of the isolation insulation layers 209. The first dielectric layer 213 preferably includes 3-valence or 5-valence second impurity ions which are the same kind as the first impurity ions included in the charge trap layers 205. Furthermore, the first dielectric layer 213 preferably is formed of a compensation layer, including the second impurity ions having a second concentration higher than the first concentration of the first impurity ions included in the charge trap layers 205.

That is, where n type (i.e., a 3-valence) impurity ions are doped into the charge trap layers 205, a concentration of the n type impurity ions included in the first dielectric layer 213 is higher than a concentration of impurity ions included in the charge trap layers 205. For example, where phosphorous (P) is doped into the charge trap layers 205, the first dielectric layer 213 can be formed of a Phospho Silicate Glass (PSG) oxide layer of a solid solution state into which phosphorous (P), having a higher concentration than phosphorous (P) doped into the charge trap layers 205, has been doped. A method of forming the PSG oxide layer is the same as that described with reference to FIG. 1D, and thus, a description thereof is omitted below.

Alternatively, where p type (i.e., a 5-valence) impurity ions, such as boron (B), are included in the charge trap layers 205, the first dielectric layer 213 can be formed of a Boron Silicate Glass (BSG) oxide layer, including a higher concentration of boron (B) than the charge trap layers 205. Next, the second impurity ions included in the first dielectric layer 213 are diffused toward the charge trap layers 205. The diffusion can be performed through an annealing process, such as a furnace process or a Rapid Thermal Process (RTP). During the diffusion process, temperature can be set in the range of 100° C. to 1000° C., but is preferably set to 780° C., so that the second impurity ions within the first dielectric layer 213 can be diffused toward the charge trap layers 205.

The second impurity ions of the first dielectric layer 213 are diffused toward the charge trap layers 205 and added thereto. Accordingly, in the second exemplary embodiment of this disclosure, although the first impurity ions included in the charge trap layers 205 are externally discharged and lost after forming the charge trap layers 205, the loss of the first impurity ions of the charge trap layers 205 can be compensated for by the second impurity ions.

Meanwhile, in the process of reducing the top width of the charge trap layer 205, the first impurity ions gathered on the surfaces of the charge trap layer 205 can be lost. In the second exemplary embodiment of this disclosure, after reducing the top width of the charge trap layer 205, the second impurity ions within the first dielectric layer 213 are diffused into the charge trap layer 205. Accordingly, the first impurity ions of the charge trap layer 205, lost in the process of reducing the top width of the charge trap layer 205, can be compensated for.

Furthermore, in the second exemplary embodiment of this disclosure, impurity ions are added to the charge trap layers 205 by using not an ion implantation process, but a diffusion process. Accordingly, the threshold voltage Vt of a channel can be prevented from shifting due to the impurity ions concentrated to the edges of the active regions A by the ion implantation process.

Referring to FIG. 2B, after performing the diffusion process, a second dielectric layer 215 formed of a nitride layer and a third dielectric layer 217 formed of an oxide layer are formed over the first dielectric layer 213. Thus, a dielectric layer 219, having an Oxide/Nitride/Oxide (ONO) stack structure including the oxide layer, the nitride layer, and the oxide layer, is formed.

Referring to FIG. 2C, after forming the dielectric layer 219, a conductive layer 221 for a control gate is formed over the dielectric layer 219. The conductive layer 221 can be formed of a polysilicon layer into which impurities are doped, a stack layer of a polysilicon layer and a metal silicide layer, or a stack layer of a polysilicon layer and a metal layer.

In the second exemplary embodiment of this disclosure, impurity ions within the first dielectric layer 213 are diffused into the charge trap layers 205 by means of the first dielectric layer 213, including the impurity ions having a higher concentration than impurity ions within the charge trap layers 205. Accordingly, the concentration of the impurity ions within the charge trap layers 205 can be increased. Consequently, in an exemplary embodiment, the deterioration of a distribution characteristic with respect to threshold voltages of a NAND flash memory device and occurrence of a read operation failure because the concentration of the impurity ions within the charge trap layers 205 is lowered, can be prevented.

Meanwhile, in the second exemplary embodiment of this disclosure, impurity ions are added to the charge trap layers 205 by using a diffusion process, not an ion implantation process. Accordingly, the threshold voltage Vt of a channel can be prevented from shifting due to the impurity ions concentrated to the edges of the active regions A by the ion implantation process.

Furthermore, in the second exemplary embodiment of this disclosure, the first dielectric layer 213 (i.e., the lowest layer of the ONO structure) is made of materials which can be used to compensate the concentration of impurity ions included in the charge trap layers 205. Accordingly, the process can be simplified, as compared with the first exemplary embodiment, because there is no need to have an additional process for forming the compensation layer.

Figure 3A:
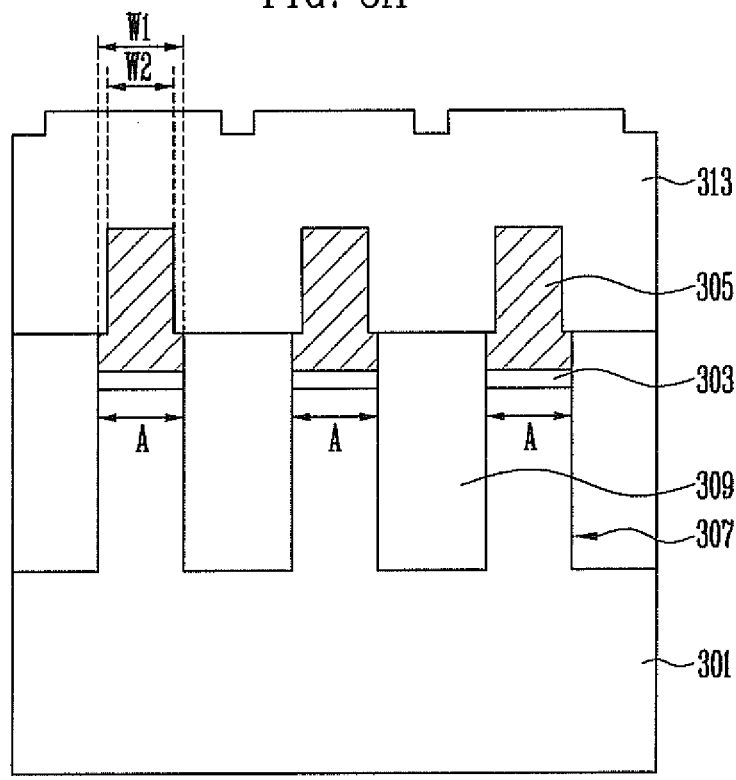
FIGS. 3A to 3C are cross-sectional views illustrating a method of forming the patterns of a nonvolatile memory device according to a third exemplary embodiment of this disclosure.
Figure 3B:
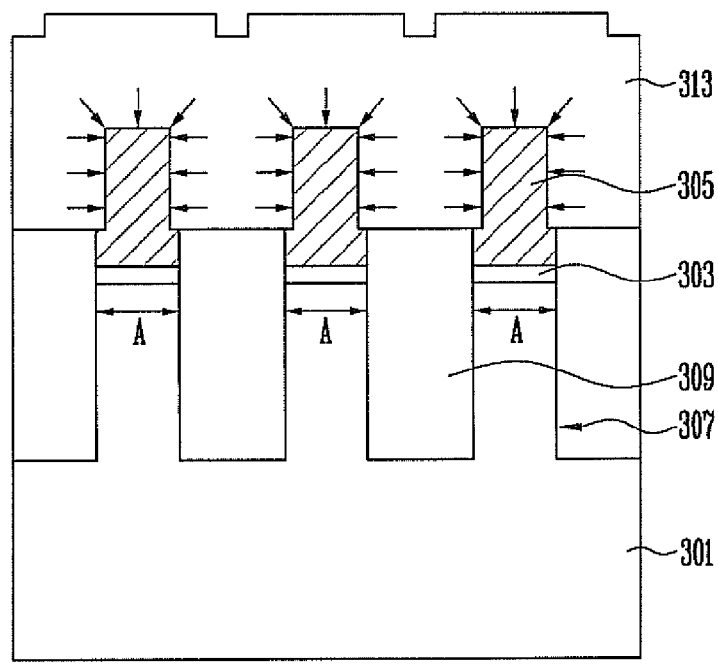
Figure 3C:
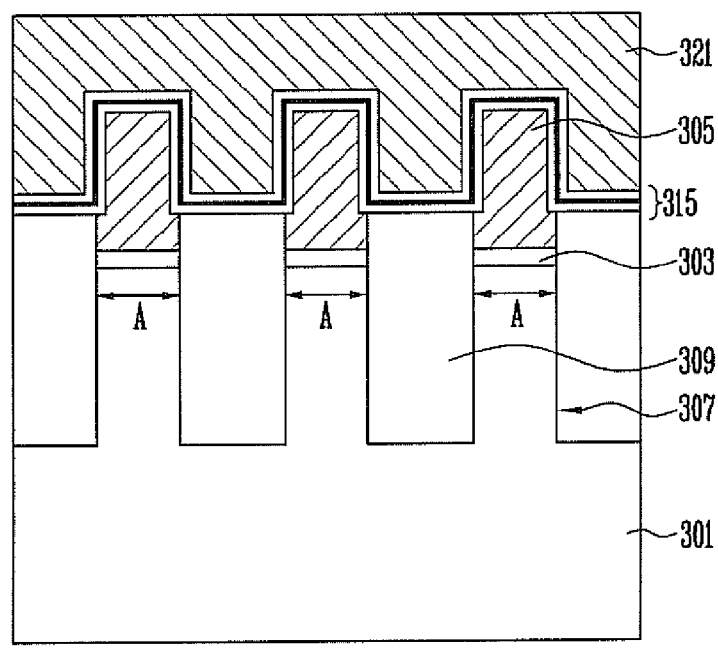

FIGS. 3A to 3C are cross-sectional views illustrating a method of forming the patterns of a nonvolatile memory device according to a third exemplary embodiment of this disclosure. In particular, a method of manufacturing a NAND flash memory device is described below as an example with reference to FIGS. 3A to 3C.

Referring to FIG. 3A, there is provided a semiconductor substrate 301, including active regions A and isolation regions. Trenches 307 and isolation insulation layers 309 are formed in the respective isolation regions of the semiconductor substrate 301. Furthermore, a tunnel insulating layer 303 and a charge trap layer 305, including first impurity ions of a first concentration, are patterned to be formed with a first width W1 over the active regions A of the semiconductor substrate 301, spaced apart from one another by the trenches 307 and the isolation insulation layers 309.

A method of forming the trenches 307 and the isolation insulation layers 309 and a method of patterning the tunnel insulating layer 303 and the charge trap layer 305 are the same as those of FIG. 1A, and so descriptions thereof are omitted below.

Meanwhile, the isolation insulation layers 309 are etched by an etch process, such as etch-back, thereby forming isolation structures having a controlled Effective Field Height (EFH). Here, a top surface of the isolation structures is preferably controlled to be lower than a top surface of the charge trap layers 305 such that the area where the charge trap layer 305 of a gate pattern comes into contact with a control gate layer can be increased and so the coupling ratio between them can be improved. Furthermore, the top surface of the isolation structures is preferably controlled to be higher than a top surface of the tunnel insulating layers 303 in order to prevent a leakage current from being generated because of the exposed active regions A.

As a result of the etch process for forming the isolation structures with the appropriate EFH, sidewalls on the upper side of the charge trap layer 305, protruding from the isolation structure, are exposed, while sidewalls on the lower side of the charge trap layer 305 are shielded by the isolation structures.

Next, a process for reducing the width of the upper side (hereinafter referred to as a 'top width') of the charge trap layer 305, protruding from the isolation structure, to a second width W2 smaller than the first width W1 and a process of forming a compensation layer 313 can be performed at the same time.

The compensation layer 313 preferably includes 3-valence or 5-valence second impurity ions which are the same kind as the first impurity ions included in the charge trap layers 305. Furthermore, the compensation layer 313 preferably includes the second impurity ions having a second concentration higher than the first concentration of the first impurity ions included in the charge trap layers 305.

That is, in case where n type (i.e., a 3-valence) impurity ions are doped into the charge trap layers 305, a concentration of the n type impurity ions included in the compensation layer 313 is preferably higher than a concentration of impurity ions included in the charge trap layers 305. For example, where phosphorous (P) is doped into the charge trap layers 305, the compensation layers 313 can be formed of a Phospho Silicate Glass (PSG) oxide layer of a solid solution state into which phosphorous (P), having a higher concentration than phosphorous (P) doped into the charge trap layers 305, has been doped. A method of forming the PSG oxide layer is the same as that described with reference to FIG. 1D, and thus, a description thereof is omitted below. Alternatively, where p type (i.e., a 5-valence) impurity ions, such as boron (B), are included in the charge trap layers 305, the compensation layer 313 can be formed of a Boron Silicate Glass (BSG) oxide layer, including a higher concentration of boron (B) than the charge trap layers 305.

In the process of forming the PSG oxide layer, the top surface and sidewalls of the charge trap layers 305, protruding from the isolation layers 309, can be oxidized. Accordingly, although an additional oxidization process for reducing the top width of the charge trap layer 305 to the second width W2 smaller than the first width W1 is not performed, the top width of the charge trap layer 305 can be narrowed to the second width W2 through the process of forming the compensation layer 313.

Referring to FIG. 3B, the second impurity ions included in the compensation layer 313 are diffused toward the charge trap layers 305. The diffusion can be performed through an annealing process, such as a furnace process or a Rapid Thermal Process (RTP). During the diffusion process, the temperature can be set in the range of 100° C. to 1000° C., and is preferably set to 780° C., so that the second impurity ions within the compensation layer 313 can be diffused toward the charge trap layers 305.

The second impurity ions of the compensation layer 313 are diffused toward the charge trap layers 305 and added thereto. Accordingly, in the third exemplary embodiment of this disclosure, although the first impurity ions included in the charge trap layers 305 are externally discharged and lost after forming the charge trap layers 305, the lost first impurity ions of the charge trap layers 305 can be compensated for by the second impurity ions.

Furthermore, in the third exemplary embodiment of this disclosure, impurity ions are added to the charge trap layers 305 by using not an ion implantation process, but a diffusion process. Accordingly, the threshold voltage Vt of a channel can be prevented from shifting due to the impurity ions concentrated to the edges of the active regions A by the ion implantation process.

Referring to FIG. 3C, after performing the diffusion process, the compensation layer 313 is removed to expose the charge trap layers 305 and the isolation layers 309.

Next, a dielectric layer 315 is formed on the exposed top surface and sidewalls of the charge trap layers 305 and the exposed top surface of the isolation layers 309. The dielectric layer 315 can be formed of a stack layer of an oxide layer, a nitride layer, and an oxide layer or can be formed of a high-k layer, such as an $Al_2O_3$ layer, a $ZrO_2$ layer, an $HfO_2$ layer, or a stack layer of them.

Meanwhile, the dielectric layer 315 is formed in the state in which the top width of the charge trap layer 305 is reduced, and so the gap between the patterned top surfaces of the charge trap layers 305 is widened. Accordingly, the dielectric layers 315 formed on the sidewalls of the charge trap layers 305 can be spaced apart from one another.

Next, a conductive layer 321 for a control gate is formed over the dielectric layers 315. The conductive layer 121 can be formed of a polysilicon layer into which impurities are doped, a stack layer of a polysilicon layer and a metal silicide layer, or a stack layer of a polysilicon layer and a metal layer.

The conductive layer 321 is formed to fill the space between the patterned charge trap layers 305. The reason why the conductive layer 321 can be formed in the space between the charge trap layers 305 is that the dielectric layer 315 formed on the sidewalls of the charge trap layer 105 are spaced apart from one another.

Although not shown, in the third exemplary embodiment of this disclosure, the compensation layer can be used as the lowest layer of an ONO structure.

In accordance with an exemplary embodiment of this disclosure, impurity ions within the compensation layer are diffused into the charge trap layers, thus compensating for impurity ions lost in the charge trap layers. Accordingly, the deterioration of a distribution characteristic with respect to threshold voltages of a device and the occurrence of a read operation failure because a concentration of the impurity ions within the charge trap layers is lowered, can be prevented.

Furthermore, in accordance with an exemplary embodiment of the present disclosure, impurity ions are added to the charge trap layers by using a diffusion process, not an ion implantation process. Accordingly, the threshold voltage of a channel can be prevented from shifting due to the impurity ions concentrated to the edges of the active regions by the ion implantation process.

While the present invention has been described with respect to the specific embodiments, it will be apparent to those skilled in the art that various changes and modifications may be made without departing from the spirit and scope of the invention as defined in the following claims.

What is claimed is:

1. A method of manufacturing a nonvolatile memory device, the method comprising:
    forming a tunnel insulating layer over a semiconductor substrate;
    forming a charge trap layer, including first impurity ions of a first concentration, over the tunnel insulating layer;
    forming a compensation layer, including second impurity ions of a second concentration, over the charge trap layer;
    diffusing the second impurity ions within the compensation layer toward the charge trap layer;
    removing the compensation layer;
    forming a dielectric layer on surfaces of the charge trap layer; and
    forming a conductive layer for a control gate on the dielectric layer.

2. A method of manufacturing a nonvolatile memory device, the method comprising:
    forming a tunnel insulating layer over a semiconductor substrate;
    forming a charge trap layer, including first impurity ions of a first concentration, over the tunnel insulating layer;
    forming a first dielectric layer, including second impurity ions of a second concentration, along the surface of the charge trap layer;
    diffusing the second impurity ions within the first dielectric layer toward the charge trap layer;
    stacking second and third dielectric layers over the first dielectric layer; and
    forming a conductive layer for a control gate on the third dielectric layer.

3. A method of manufacturing a nonvolatile memory device, the method comprising:
    forming a charge trap layer doped with first impurity ions, having a first concentration, over a semiconductor substrate;
    patterning the charge trap layer to form trenches in the substrate between the patterned charge trap layer;
    filling the trenches with isolation layers to expose the upper side of the patterned charge trap layer;
    forming a compensation layer doped with second impurity ions, having a higher concentration than the first concentration, over the charge trap layer; and
    diffusing the second impurity ions within the compensation layer toward the charge trap layer.

4. The method of claim 1, before the forming of the compensation layer, further comprising:
    patterning the tunnel insulating layer and the charge trap layer to expose the semiconductor substrate;
    etching the exposed semiconductor substrate to form trenches; and
    filling the trenches with isolation layers.

5. The method of claim 1, wherein the compensation layer is made of Phospho Silicate Glass (PSG) or Boron Silicate Glass (BSG) of a solid solution state.

6. The method of claim 1, wherein the charge trap layer includes a doped polysilicon layer formed using gas, including the first impurity ions, and silicon (Si) source gas.

7. The method of claim 1, wherein the charge trap layer includes a doped polysilicon layer formed by implanting the first impurity ions into an undoped polysilicon layer formed using a silicon (Si) source gas.

8. The method of claim 1, wherein the first impurity ions include 3-valence or 5-valence ions.

9. The method of claim 1, wherein the second concentration is higher than the first concentration.

10. The method of claim 4, wherein the isolation layers are formed to have a top surface lower than a top surface of the charge trap layer, and higher than a top surface of the tunnel insulating layer.

11. The method of claim 4, wherein the surfaces of the patterned charge trap layer is oxidized during the forming of the compensation layer.

12. The method of claim 4, after the patterning of the charge trap layer, further comprising:
    forming an oxide layer by oxidizing the surfaces of the patterned charge trap layer; and
    removing the oxide layer to reduce the width of an upper side of the charge trap layer.

13. The method of claim 8, wherein the second impurity ions have identical 3-valence or 5-valence ions as the first impurity ions.

14. The method of claim 2, before the forming of the first dielectric layer, further comprising:
   patterning the tunnel insulating layer and the charge trap layer to expose the semiconductor substrate;
   etching the exposed semiconductor substrate to form trenches; and
   filling the trenches with isolation insulation layers.

15. The method of claim 2, wherein the first dielectric layer is made of Phospho Silicate Glass (PSG) or Boron Silicate Glass (BSG) of a solid solution state.

16. The method of claim 2, wherein the second dielectric layer is formed of a nitride layer, and the third dielectric layer is formed of an oxide layer.

17. The method of claim 14, wherein, the surface of the patterned charge trap layer is oxidized during the forming of the first dielectric layer.

18. The method of claim 14, after the patterning of the charge trap layer, further comprising:
   forming an oxide layer by oxidizing the surface of the patterned charge trap layer; and
   removing the oxide layer to reduce the width of an upper side of the charge trap layer.

19. The method of claim 3, further comprising:
   removing the compensation layer;
   forming a dielectric layer along a surface of the charge trap layer; and
   forming a conductive layer for a control gate on the dielectric layer.

20. The method of claim 3, further comprising:
   stacking second and third dielectric layers over the compensation layer; and
   forming a conductive layer for a control gate on the third dielectric layer,
   wherein the compensation layer includes a first dielectric layer.

* * * * *